United States Patent
Yoon et al.

(10) Patent No.: US 7,577,785 B2
(45) Date of Patent: Aug. 18, 2009

(54) CONTENT ADDRESSABLE MEMORY WITH MIXED SERIAL AND PARALLEL SEARCH

(75) Inventors: Sei Seung Yoon, San Diego, CA (US); Seong-Ook Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 595 days.

(21) Appl. No.: 11/240,322

(22) Filed: Sep. 30, 2005

(65) Prior Publication Data

US 2007/0079058 A1    Apr. 5, 2007

(51) Int. Cl.
*G06F 12/00* (2006.01)
(52) U.S. Cl. .................. 711/108; 711/100; 711/154; 365/49.1; 365/203
(58) Field of Classification Search .................. 711/108
See application file for complete search history.

(56) References Cited

U.S. PATENT DOCUMENTS

| | | | | |
|---|---|---|---|---|
| 5,574,875 A | * | 11/1996 | Stansfield et al. | ............... 711/3 |
| 5,602,795 A | * | 2/1997 | Sandhu | .................. 365/230.06 |
| 5,978,246 A | | 11/1999 | Shindo | |
| 2003/0219034 A1 | * | 11/2003 | Lotter et al. | ................. 370/469 |

OTHER PUBLICATIONS

Kostas Pagiamtzis, and Ali Sheikholeslami, "A Low-Power Content-Addressable Memory (CAM) Using Pipelined Hierarchical Search Scheme", Sep. 2004, IEEE Journal of Solid-State Circuits, vol. 39, No. 9.*

Efthymiou et al; *An Adaptive Serial-Parallel CAM Architecture for Low-Power Cache Blocks* Department of Computer Science, University of Manchester, Oxford Road, Manchester M13 9PL, United Kingdom, pp. 136-141 ISLPED Aug. 12-14, 2002.

International Search Report—PCT/US2006/038986, International Search Authority—European Patent Office—Feb. 23, 2007.

Written Opinion—PCT/US2006/038986, International Search Authority—European Patent Office—Feb. 23, 2007.

International Preliminary Report on Patentability—PCT/US2006/038986, International Search Authority—European Patent Office—Apr. 1, 2008.

* cited by examiner

*Primary Examiner*—Kevin L Ellis
*Assistant Examiner*—Kalpit Parikh
(74) *Attorney, Agent, or Firm*—Charles D. Brown; Kristine U. Ekwueme

(57) ABSTRACT

A mixed serial-parallel content addressable memory (CAM) includes serial CAM cells and parallel CAM cells that are arranged in multiple (N) columns and multiple (M) rows. Each row includes at least one serial CAM cell and at least two parallel CAM cells. The M rows are searched in parallel. For each row, the serial CAM cells are searched sequentially, and the parallel CAM cells are selectively searched in parallel. The CAM further includes a driver that generates search lines for the N columns of CAM cells, one search line per column. The driver sets the search lines to an N-bit value to search for in the CAM. Prior to each search operation, the driver presets at least one search line for at least one column of serial CAM cells to precharge a match line for each row.

24 Claims, 8 Drawing Sheets

CONTENT ADDRESSABLE MEMORY WITH MIXED SERIAL AND PARALLEL SEARCH

BACKGROUND

I. Field

The present disclosure relates generally to electronic circuits, and more specifically to a content addressable memory.

II. Background

A content addressable memory (CAM) is an array of memory cells and associated comparison circuits. These comparison circuits allow for fast searches of the contents of the memory array. All of the rows of the memory array may be searched/evaluated in parallel to determine whether or not an input value matches the value stored in any of the rows. Each row is associated with a respective match line that indicates the search result for that row. The match line for each row that matches the input value is asserted (e.g., to logic high) to indicate a match, and the match line for each row that does not match the input value is de-asserted (e.g., to logic low) to indicate a mismatch.

CAM is used for various applications such as, e.g., a cache memory. The cache memory may be accessed faster than other types of memory and is used to store data that is more likely to be accessed by a processor. The cache memory may include a random access memory (RAM) that stores the data and a CAM that stores the addresses of the data. To determine whether a given word of data is stored in the cache-memory, the CAM is searched to determine whether the address of this word matches any of the addresses stored in the CAM. If there is a match, then the desired word may be retrieved from the RAM for use.

The CAM may be searched extensively, e.g., for each processor instruction with a memory access. Hence, the performance of the CAM typically has a large impact on the performance of the processor. Fast search speed may be achieved by searching all of the rows of the CAM in parallel. However, the parallel search consumes a large amount of power, which is undesirable for many applications.

There is therefore a need in the art for a CAM with high performance and lower power consumption.

SUMMARY

A mixed serial-parallel CAM that is capable of achieving high performance and lower power consumption is described herein. The CAM includes serial CAM cells and parallel CAM cells that are arranged in multiple (N) columns and multiple (M) rows. Each row includes at least one serial CAM cell, at least two parallel CAM cells, and a match line and a virtual ground line for the parallel CAM cells in that row. The M rows are searched in parallel. For each row, the serial CAM cells are searched sequentially, and the parallel CAM cells are selectively searched in parallel. For each row, the parallel CAM cells may be searched in parallel (1) only if the serial CAM cells match, which reduces power consumption, or (2) concurrently with the searching of the serial CAM cells, which improves search speed. The virtual ground line for each row is controlled to enable or disable the searching of the parallel CAM cells in that row.

The CAM further includes a driver that generates N search lines for the N columns of CAM cells, one search line per column. The driver sets the N search lines to an N-bit value to search for in the CAM. Prior to each search operation, the driver presets at least one search line for at least one column of serial CAM cells to precharge the match line for each row. Presetting refers to setting or forcing a line to a predetermined logic value (e.g., logic low). For example, if each row includes four serial CAM cells, then the driver may preset the search line for the second CAM cell or the fourth CAM cell in the row, as described below. The presetting of at least one search line avoids the need for a timing signal for the serial CAM section. The omission of this timing signal may improve search speed.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
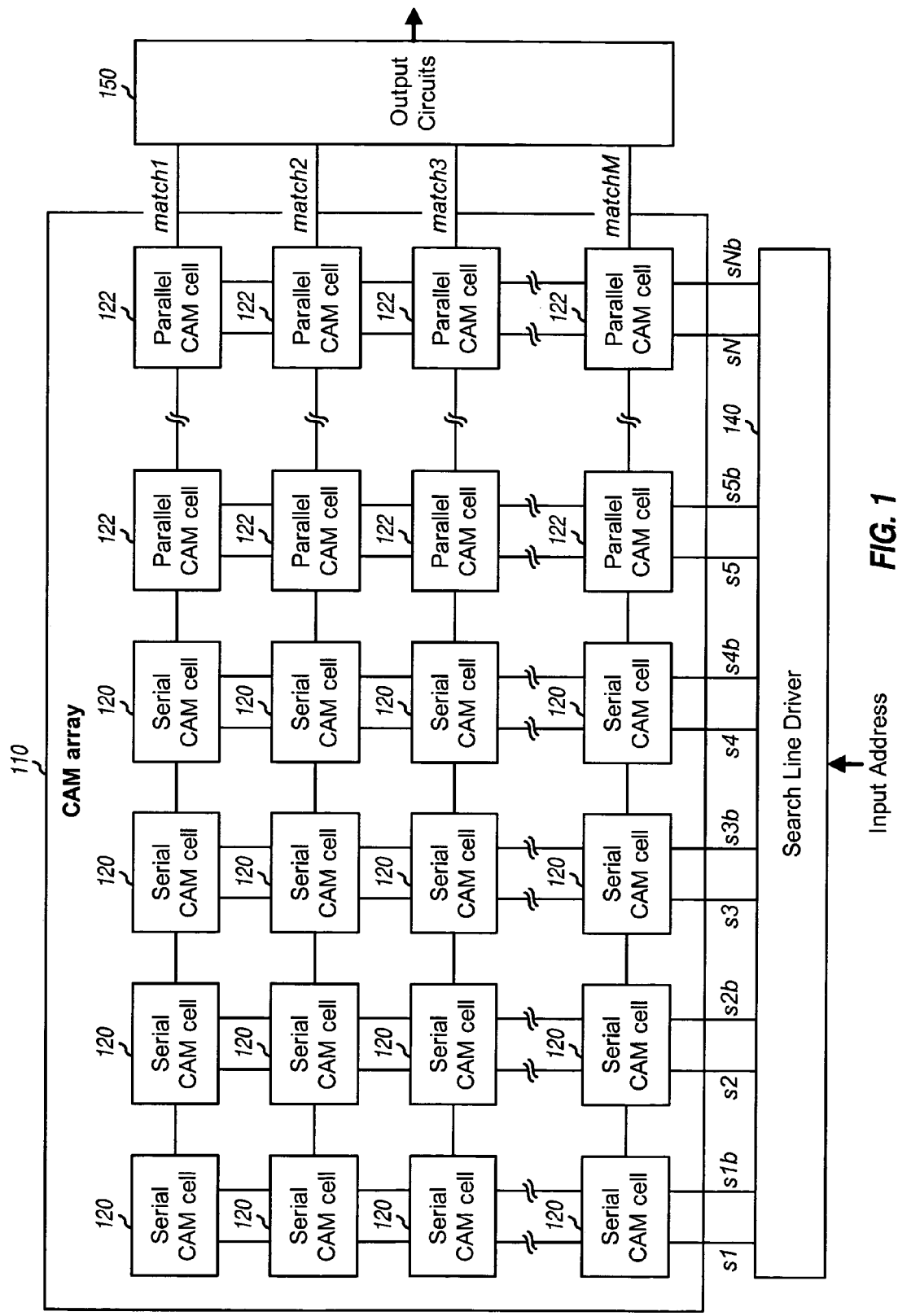
FIG. 1 shows a mixed serial-parallel CAM.

FIG. 1 shows a block diagram of a mixed serial-parallel CAM 100. CAM 100 includes a CAM array 110, a search line driver 140, and output circuits 150. CAM array 110 is a two-dimensional array of M rows by N columns of CAM cells 120 and 122, where M and N may each be any integer value. Each row in CAM array 110 includes N CAM cells that collectively store an entry, e.g., for an address. Each row is associated with a match line having a logic value that is determined by all of the CAM cells in that row. Each of the N columns corresponds to a different bit position of an N-bit input address. Each column is associated with a differential search line that couples to all CAM cells in that column. Each search line has a logic value that is determined by one bit of the input address. The logic value on each search line may be compared against the logic value stored in each of the M CAM cells coupled to that search line. The N-bit input address may be provided to all M rows of the CAM array and simultaneously compared against all M entries in the CAM array.

Search line driver 140 receives the input address and generates the search lines for the N columns of CAM cells. Output circuits 150 receive the match lines for the M rows and provide the desired output. For example, output circuits 150 may perform encoding and provide a K-bit value that indicates a specific row that matches the input address, where $K = \log_2 \lceil M \rceil$ and $\lceil \: \rceil$ denotes a ceiling operation.

In general, a CAM may be designed to perform parallel search, serial search, or mixed serial-parallel search. For all three search schemes, all M rows of the CAM array may be searched in parallel to look for any matches with the input address. For the parallel search scheme, all N bits of each row are searched in parallel to determine whether that row matches the input address. The parallel search scheme provides the search results in the shortest amount of time among the three schemes but consumes the most power because of the parallel comparisons. For the serial search scheme, the N bits of each row are searched in a sequential order, typically starting with the least significant bit (LSB). The serial search for each row terminates once a mismatch between an input address bit and a stored bit is detected. The serial search scheme consumes the least amount of power among the three schemes because another stored bit is compared only if all preceding stored bits match their corresponding address bits. However, the serial search scheme provides the search results in the longest amount of time among the three schemes because of the serial comparisons. The mixed serial-parallel search scheme performs a serial search for some number of bits and a parallel search for the remaining bits to obtain both high speed and lower power consumption. The mixed serial-parallel scheme is described below.

For the embodiment shown in FIG. 1, CAM array 110 includes four columns of serial CAM cells 120 and N-4 columns of parallel CAM cells 122. In general, a CAM may include any number of columns of serial CAM cells and any number of columns of parallel CAM cells. The total number of columns, N, is typically determined by the application for which the CAM is used. The number of columns of serial CAM cells may be selected based on a tradeoff between power consumption and search speed. Each serial CAM cell 120 and each parallel CAM cell 122 may be implemented as described below.

Figure 2B:
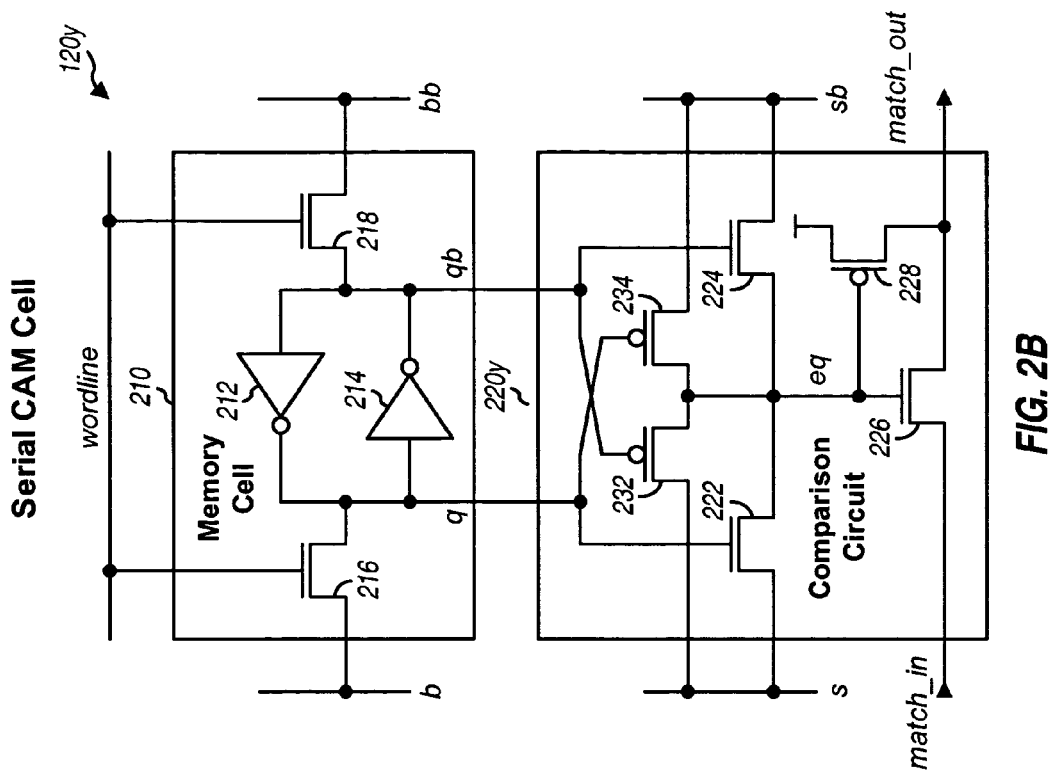
FIGS. 2A and 2B show two exemplary designs for a serial CAM cell.
Figure 2A:
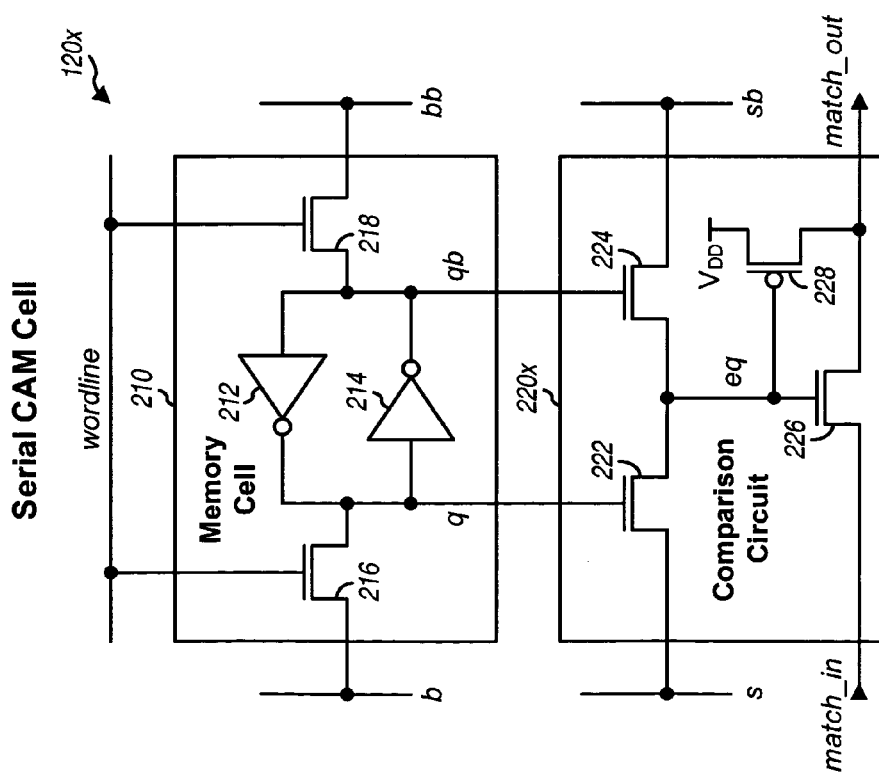

FIG. 2A shows a schematic diagram of a serial CAM cell 120x, which may be used for each of serial CAM cells 120 in FIG. 1. CAM cell 120x includes a memory cell 210 that stores a data bit and a comparison circuit 220x that compares the stored data bit against an address bit. Memory cell 210 includes a pair of cross-coupled inverters 212 and 214. The output of inverter 212 couples to the input of inverter 214, the drain of an N-channel field effect transistor (N-FET) 216, and a data line q. The output of inverter 214 couples to the input of inverter 212, the drain of an N-FET 218, and a complementary data line qb. The gates of N-FETs 216 and 218 couple to a word line, the source of N-FET 216 couples to a bit line b, and the source of N-FET 218 couples to a complementary bit line bb. The word line is used to select and enable a row of CAM cells for programming. The differential bit line is used to write a data bit into memory cell 210. Inverters 212 and 214 store the data bit via a positive feedback mechanism. The programming of memory cell 210 is known in the art.

Comparison circuit 220x includes three N-FETs 222, 224 and 226, and a P-channel FET (P-FET) 228. N-FETs 222 and 224 have their gates coupled to data line q and complementary data line qb, respectively, their sources coupled to a search line s and a complementary search line sb, respectively, and their drains coupled together and further to the gates of FETs 226 and 228. N-FET 226 has its source coupled to an input match line match_in and its drain coupled to an output match line match_out. P-FET 228 has its source coupled to the output match line and its drain coupled to a supply voltage $V_{DD}$.

Comparison circuit 220x operates as follows. Differential search line, s and sb, is set to the value of an address bit. If the address bit matches the data bit stored in memory cell 210, then search line s matches data line q, complementary search line sb matches complementary data line qb, either N-FET 222 or 224 is turned ON, and node eq is pulled to logic high by the N-FET that is turned ON. The logic high on node eq turns OFF P-FET 228 and turns ON N-FET 226, which passes the logic value on the input match line to the output match line. Alternatively, if the address bit does not match the stored data bit, then either N-FET 222 or 224 is turned ON, node eq is pulled down to logic low by the N-FET that is turned ON, N-FET 226 is turned OFF, P-FET 228 is turned ON, and the output match line is pulled up to logic high. Comparison circuit 220x thus passes the logic value on the input match line to the output match line if there is a match and provides a high logic value on the output match line if there is a mismatch.

FIG. 2B shows a schematic diagram of a serial CAM cell 120y, which may also be used for each of serial CAM cells 120 in FIG. 1. CAM cell 120y includes a memory cell 210 that stores a data bit and a comparison circuit 220y that compares the stored data bit against an address bit. Comparison circuit 220y includes N-FETs 222, 224 and 226 and P-FET 228 that are coupled as described above for comparison circuit 220x in FIG. 2A. Comparison circuit 220y further includes P-FETs 232 and 234 having their gates coupled to complementary data line qb and data line q, respectively, their sources coupled to search line s and complementary search line sb, respectively, and their drains coupled together and further to the gates of FETs 226 and 228. N-FET 222 and P-FET 232 form a complementary metal oxide semiconductor (CMOS) gate that is controlled by the q and qb lines. N-FET 224 and P-FET 234 form another CMOS gate that is controlled by the qb and q lines.

Figure 2D:
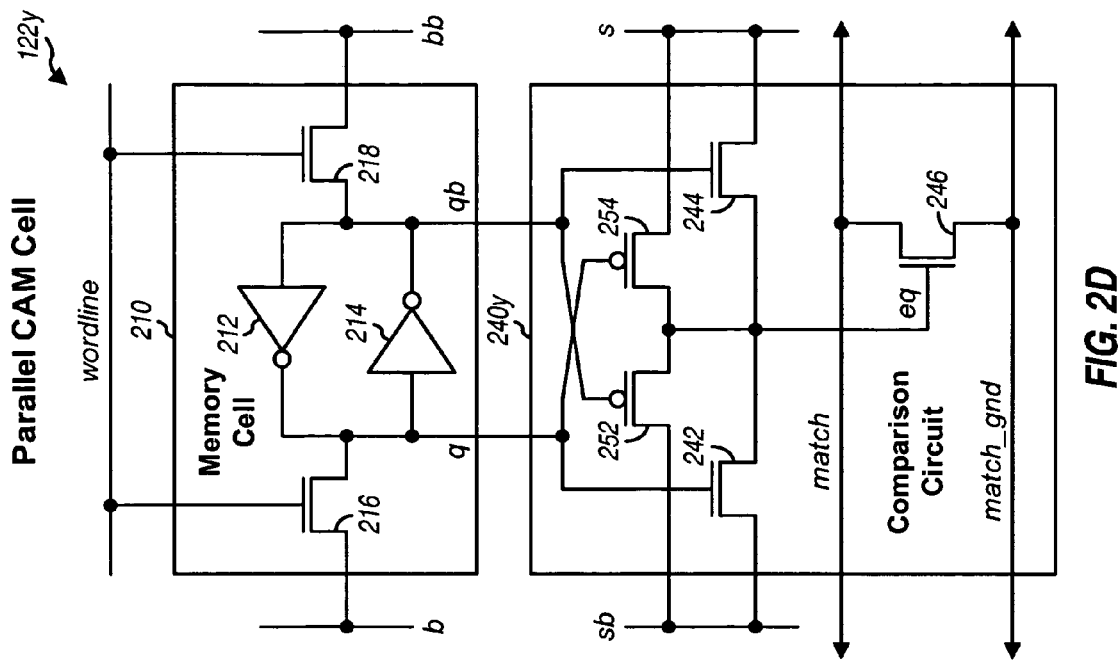
FIGS. 2C and 2D show two exemplary designs for a parallel CAM cell.
Figure 2C:
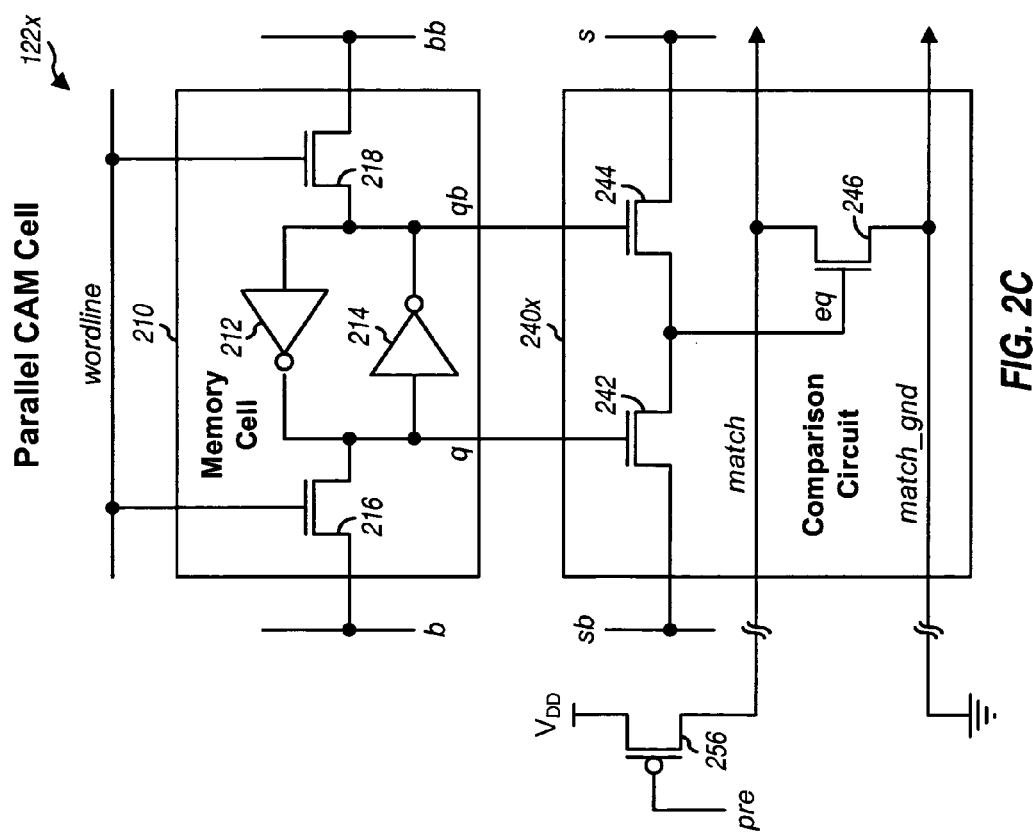

FIG. 2C shows a schematic diagram of a parallel CAM cell 122x, which may be used for each of parallel CAM cells 122 in FIG. 1. CAM cell 122x includes a memory cell 210 that stores a data bit and a comparison circuit 240x that compares the stored data bit against an address bit. Comparison circuit 240x includes three N-FETs 242, 244 and 246. N-FETs 242 and 244 have their gates coupled to data line q and complementary data line qb, respectively, their sources coupled to complementary search line sb and search line s, respectively, and their drains coupled together and further to the gate of N-FET 246. N-FET 246 has its drain coupled to a match line and its source coupled to a virtual circuit ground match_gnd.

A P-FET 256 is used to precharge the match line. P-FET 256 has its drain coupled to the supply voltage $V_{DD}$, its source coupled to the match line, and its gate coupled to a preset line pre.

Comparison circuit 240x operates as follows. Prior to performing a search on a row of CAM cells, the pre line is brought to logic low, P-FET 256 is turned ON, the match line is precharged to the supply voltage $V_{DD}$, the pre line is then brought to logic high, and P-FET 256 is turned OFF. Differential search line, s and sb, is set to an address bit value. If the address bit matches the stored data bit, then either N-FET 242 or 244 is turned ON and pulls node eq to logic low, N-FET 246 is turned OFF, and the match line is not pulled down to the virtual circuit ground. Alternatively, if the address bit does not match the stored data bit, then either N-FET 242 or 244 is turned ON and pulls node eq to logic high, N-FET 246 is turned ON, and the match line is pulled down to the virtual circuit ground. Any CAM cell that does not match pulls down the match line to logic low. If all CAM cells in the row match, then the match line remains in the precharged (logic high) state.

FIG. 2D shows a schematic diagram of a parallel CAM cell 122y, which may also be used for each of parallel CAM cells 122 in FIG. 1. CAM cell 122y includes a memory cell 210 that stores a data bit and a comparison circuit 240y that compares the stored data bit against an address bit. Comparison circuit 240y includes three N-FETs 242, 244 and 246 that are coupled as described above for comparison circuit 240x in FIG. 2C. Comparison circuit 240y further includes P-FETs 252 and 254 having their gates coupled to complementary data line qb and data line q, respectively, their sources coupled to complementary search line sb and search line s, respectively, and their drains coupled together and further to the gate of N-FET 246. N-FET 242 and P-FET 252 form a CMOS gate that is controlled by the q and qb lines. N-FET 244 and P-FET 254 form another CMOS gate that is controlled by the qb and q lines.

FIGS. 2A through 2D show some exemplary designs for the serial and parallel CAM cells. These CAM cells may also be implemented with other designs.

For the parallel search scheme, the match lines for all M rows are precharged prior to performing a search. Typically, only one row (if any) matches the input address, and the match line for this row remains at logic high. All other rows do not match, and the match lines for these rows are discharged to logic low. Each row has a relatively large parasitic capacitance. The continual precharging and discharging of the highly capacitive match lines results in high power consumption for the parallel search scheme.

For the serial search scheme, the input match line for the leftmost (or LSB) serial CAM cell in each row is set to logic low. All M rows are searched in parallel, but only one bit is searched at a time for each row until there is a mismatch or all bits in the row are searched. Power consumption is reduced since a highly capacitive match line is not discharged when there is a mismatch for any given bit. However, search speed is slower and depends on the number of CAM cells in the row. Furthermore, timing signals are typically needed to control the sequential search of the bits in each row.

The mixed serial-parallel search scheme attempts to obtain both low power consumption and high search speed. The probability of a match for any given bit may be assumed to be 50%. If the bits in each row are independent, which is generally true for the lesser significant bits, then the probability of a match after n bits is $(½)^n$, and the probability of a mismatch after n bits is $1-(½)^n$. For example, the probability of a mismatch is 75% after two bits, 87.5% after three bits, 93.75% after four bits, and so on. A serial search may be performed for a small number of bits (e.g., four bits) to obtain low power consumption. After searching this small number of bits, most rows will not match, and a parallel search may be performed for the remaining bits in each row that matches the serial portion.

Figure 3:
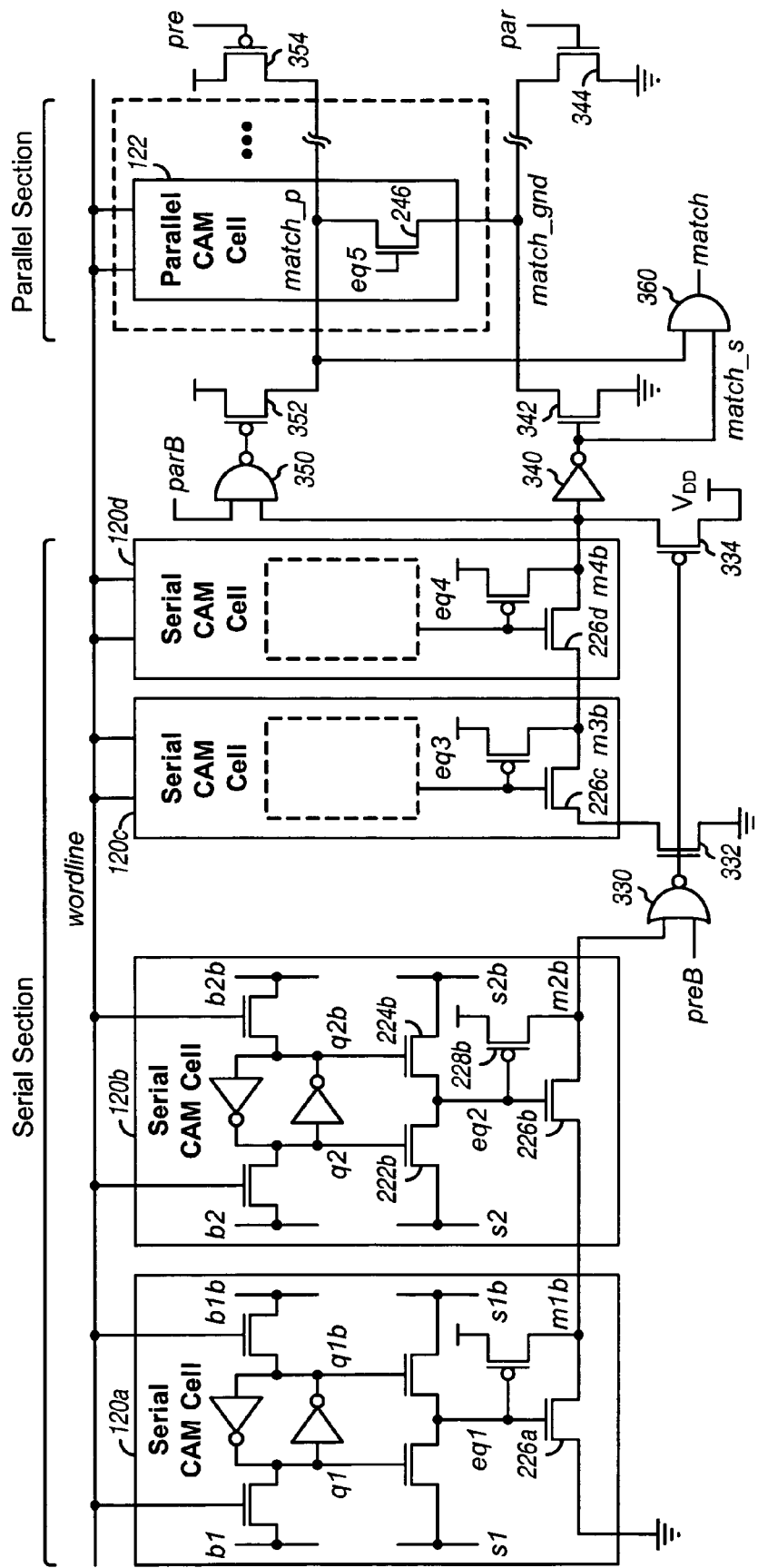
FIG. 3 shows one row of CAM cells in the mixed serial-parallel CAM.

FIG. 3 shows one row 300 of CAM cells for a mixed serial-parallel CAM. Row 300 includes a serial section with four serial CAM cells 120a through 120d and a parallel section with multiple parallel CAM cells 122. Each of serial CAM cells 120a through 120d may be implemented as shown in FIG. 2A or 2B. Each parallel CAM cell 122 may be implemented as shown in FIG. 2C or 2D.

The four serial CAM cells 120a through 120d are arranged into two pairs to limit the number of pass transistors 226 that are coupled in series and to reduce the parasitic capacitance on the input and output match lines between the serial CAM cells. Fewer pass transistors 226 reduce the voltage drop across these transistors when they are turned ON. Lower parasitic capacitance improves the transient response of the input and output match lines, which allows for faster propagation time and higher operating speed. A NOR gate 330 receives output match line m2b from CAM cell 120b and a preB signal and drives the gates of an N-FET 332 and a P-FET 334. N-FET 332 has its source coupled to circuit ground and its drain coupled to the input match line for serial CAM cell 120c. P-FET 334 has its source coupled to circuit ground and its drain coupled to output match line m4b for CAM cell 120d. An inverter 340 receives output match line m4b from CAM cell 120d and provides a match line for the serial section, match_s. N-FETs 342 and 344 have their gates coupled to the output of inverter 340 and to a par line, respectively, their sources coupled to circuit ground, and their drains coupled to a virtual circuit ground for the parallel section, match_gnd. A NAND gate 350 receives output match line m4b from CAM cell 120d and a parB signal. P-FETs 352 and 354 have their gates coupled to the output of NAND gate 350 and to the pre line, respectively, their sources coupled to a match line for the parallel section, match_p, and their drains coupled to the supply voltage $V_{DD}$. An AND gate 360 receives the match lines for the serial and parallel sections, match_s and match_p, and provides the match line for the row.

A large portion of the total power consumption for a CAM is typically due to the continual precharging and discharging of the match lines and the continual precharging and discharging of the search lines. Power consumption may be reduced by searching only a small percentage of rows in which the serial sections match, as noted above. In this case, the match lines for only a small percentage of rows are precharged and discharged. Power consumption may also be reduced by not precharging and discharging the search lines. Typically, search line s and complementary search line sb are both preset to logic low while the match lines are being precharged in order to avoid shorting the supply voltage $V_{DD}$ to circuit ground, e.g., via P-FET 256 and N-FET 246 shown in FIG. 2C. The s or sb line is then set to logic high depending on the input address bit value. The presetting of the s and sb lines to logic low results in precharging and discharging of one of these two lines. This presetting may be avoided by floating the match_gnd line while precharging the match_p line, which then prevents the supply voltage from being shorted to circuit ground. By not presetting the search lines, power is dissipated only when the input address bit changes value instead of for each search.

The architecture shown in FIG. 3 supports two modes of mixed serial-parallel search. In a sequential mode, the four serial CAM cells are searched serially, and the parallel CAM cells are searched in parallel only if all of the serial CAM cells match. In a parallel mode, the serial CAM cells are searched serially, the parallel CAM cells are searched in parallel, and the serial and parallel searches are performed at the same time so that the search results can be obtained earlier. For both modes, the match_s line for the serial section and the match_p line for the parallel section are ANDed together to generate the match line for the entire row, as shown in FIG. 3.

For the sequential mode, the par signal is at logic low, and the parB signal is at logic high. N-FET 344 is turned OFF, the match_gnd line is controlled by N-FET 342, and the output of NAND gate 350 is equal to the match_s line. If all of the serial CAM cells match, then the match_s line is at logic high, and the match_gnd line is pulled down to logic low. Conversely, if the serial CAM cells do not match, then the match_s signal is at logic low, P-FET 352 is turned ON, and the match_p line is precharged.

For the parallel mode, the par signal is at logic high, and the parB signal is at logic low. N-FET 344 is turned ON, the match_gnd line is pulled down to logic low at all times, and the parallel section is operational while the serial search is being performed. The output of NAND gate 350 is at logic high, P-FET 352 is turned OFF, and the match_p line is precharged via P-FET 354 with the pre signal.

The mixed serial-parallel search for row 300 may be performed as follows. A serial search is performed over the serial section, either sequentially one CAM cell at a time, starting with CAM cell 120a, or in parallel for all CAM cells in the serial section. Each serial CAM cell passes the search result from a prior serial CAM cell if there is a match and passes logic high if there is a mismatch.

If all serial CAM cells 120a through 120d match, then output match line m4b from CAM cell 120d is at logic low, the output of inverter 340 is at logic high, N-FET 342 is turned ON, and the match_gnd line is pulled down to circuit ground. The match_p line is precharged during a prior search, and the CAM cells in the parallel section are enabled when the match_gnd line is at circuit ground. If all parallel CAM cells 122 match, then the match_p line remains at logic high. The output of AND gate 360 is logic high if the serial and parallel sections both match.

Conversely, if any one of serial CAM cells 120a through 120d does not match, then output match line m4b from CAM cell 120d is at logic high, the output of inverter 340 is at logic low, N-FET 342 is turned OFF, the match_gnd line floats, and the parallel section is disabled. The parB line is at logic high for the sequential mode, and the logic low on the m4b line results in a logic low at the output of NAND gate 350. P-FET 352 is turned ON and precharges the match_p line. If the parallel section was not enabled in the prior search because all of the serial CAM cells did not match, then P-FET 352 only needs to replace a small amount of charge that may have leaked since the prior precharge.

If the match_p line is only precharged when there is a mismatch for the serial CAM cells, then the match_p line may be erroneous in certain situations. One such situation is a case in which the serial CAM cells match and the parallel CAM cells do not match for a given search; and the match_p line is not precharged as described above. If both the serial CAM cells and the parallel CAM cells match in the next search, then the parallel section may erroneously declare a mismatch because the match_p line was not precharged in the prior search. To avoid erroneous detection for the case described above, the match_p line may be precharged prior to each search with the preB signal. This precharge may be achieved by providing a logic high on the preB line, which results in a logic low at the output of NOR gate 330. The logic low from NOR gate 330 turns on P-FET 334 and forces a logic high on the m4b line, which turns on P-FET 352 and precharges the match_p line.

The preB line also prevents the match_gnd line from being set to logic low during precharging of the match_p line. If the preB line is not present and the m2b line is at logic low, then the output of NOR gate 330 is at logic high, N-FET 332 is turned ON, the input match line for serial CAM cell 120c is at logic low, the m4b line may be at logic low, and the match_s line may be at logic high, which would then bring the match_gnd line to logic low. The parallel section would then be enabled and may short match_p line, which is being precharged to the supply voltage $V_{DD}$. If the preB line is present and set to logic high during precharging, then the match_gnd line is prevented from being pulled down to logic low. The floating match_gnd line disables the parallel section during precharging of the match_p line.

The preB signal is generated with sufficient timing margin to ensure that NOR gate 330 provides the desired logic value for precharging. In particular, the logic state of the m2b signal should be settled before the preB line is asserted in order to ensure a valid output from NOR gate 330. This timing margin for the preB line limits the speed at which the serial section may be searched, which limits the speed at which the entire row of CAM cells may be searched.

Figure 4:
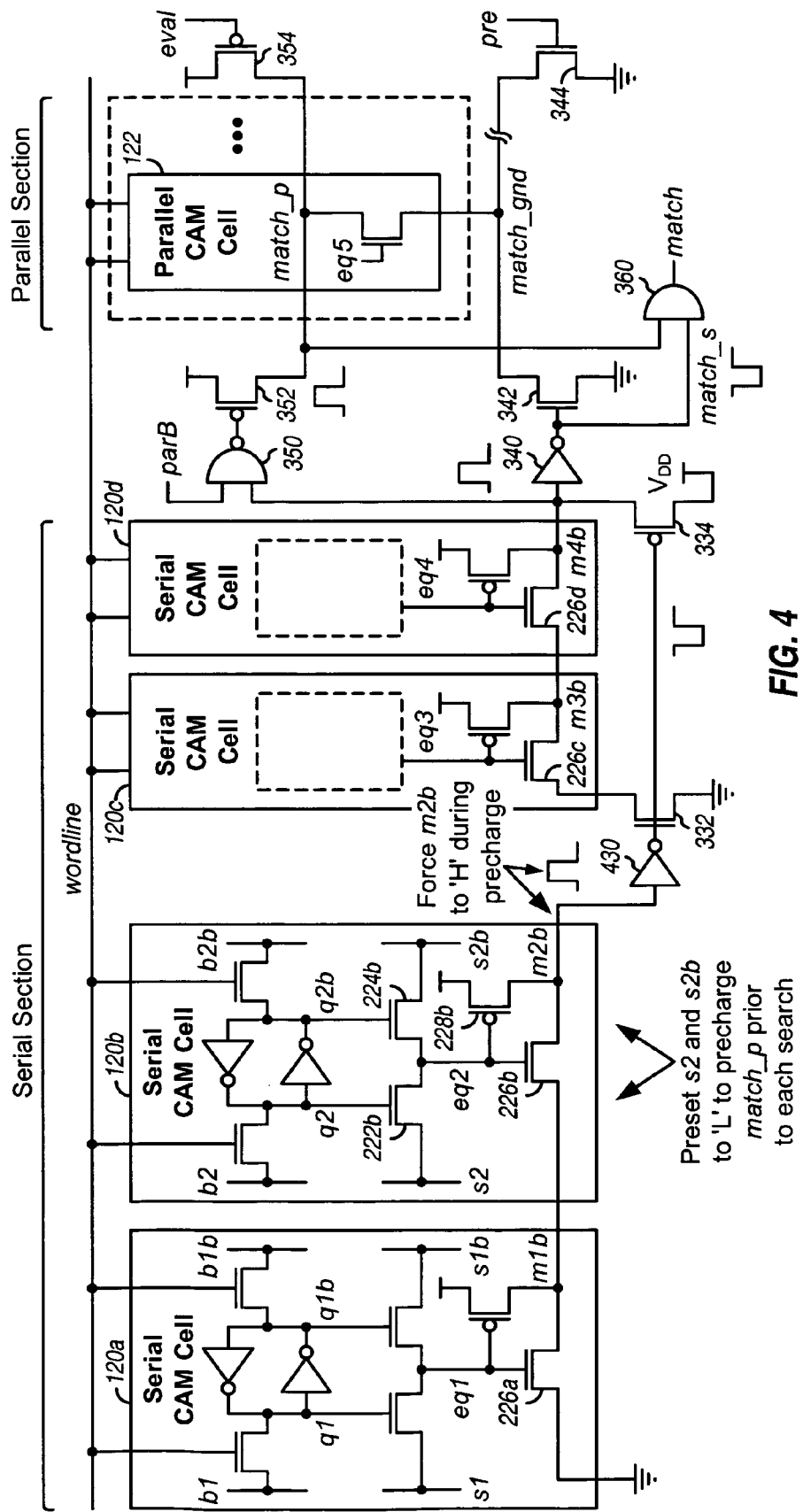
FIGS. 4, 5 and 6 show three embodiments for one row of CAM cells in the mixed serial-parallel CAM without any timing signals for the serial CAM section.

FIG. 4 shows one row 400 of CAM cells for a mixed serial-parallel CAM without any timing signals for the serial section. Row 400 includes a serial section with four serial CAM cells 120a through 120d and a parallel section with multiple parallel CAM cells 122, as shown in FIG. 3. Row 400 further includes all of the support circuitry for row 300 in FIG. 3, except for NOR gate 330. For the embodiment shown in FIG. 4, an inverter 430 replaces NOR gate 330 and has its input coupled to the m2b line from serial CAM cell 120b and its output coupled to the gates of N-FET 332 and 334. Inverter 430 and N-FET 332 form a buffer circuit for the m2b line. The buffer circuit may also be implemented with other types of circuit.

The mixed serial-parallel search for row 400 may be performed as follows. Prior to performing the search, the match_p line is precharged by presetting the search line for the second serial CAM cell 120b, so that the s2 and s2b lines are both at logic low. The logic low on the s2 and s2b lines turns on either N-FET 222b or 224b, which brings the eq2 node to logic low. The logic low on the eq2 node turns ON P-FET 228b, which pulls the m2b line to logic high and forces the output of inverter 430 to logic low. The logic low at the output of inverter 430 turns ON P-FET 334, which pulls the m4b line to logic high, forces the output of inverter 340 to logic low, and sets the output of NAND gate 350 to logic low. The logic low at the output of inverter 340 turns OFF N-FET 342, which causes the match_gnd line to float. The logic low at the output of NAND gate 350 turns ON P-FET 352, which precharges the match_p line. After precharging the match_p line, the s2 and s2b lines for serial CAM cell 120b are released and take on the value of the second input address bit. The serial search may then be performed for the serial section as described above for FIG. 3. The precharging may be performed on one phase (e.g., during logic high) of a clock signal, and the comparison may be performed on the other phase (e.g., during logic low) of the clock signal.

For the embodiment shown in FIG. 4, only the differential search line s2 and s2b for the second serial CAM cell 120b is preset prior to each search to precharge the match_p line. The search lines for all of the other serial CAM cells in the row may or may not be preset. For example, the first serial CAM cell 120a may also be preset, but this is not required to precharge the match_p line. In another embodiment, the search line for the last serial CAM cell 120d is preset prior to each search, and the search lines for all other serial CAM cells may or may not be preset. In yet another embodiment, the search lines for all serial CAM cells are preset prior to each search. In general, the search lines for any number of serial CAM cells may be preset to precharge the match_p line. Since power is dissipated for each search line that is preset, it is desirable to preset as few search lines as possible (e.g., one search line) prior to each search.

Figure 5:
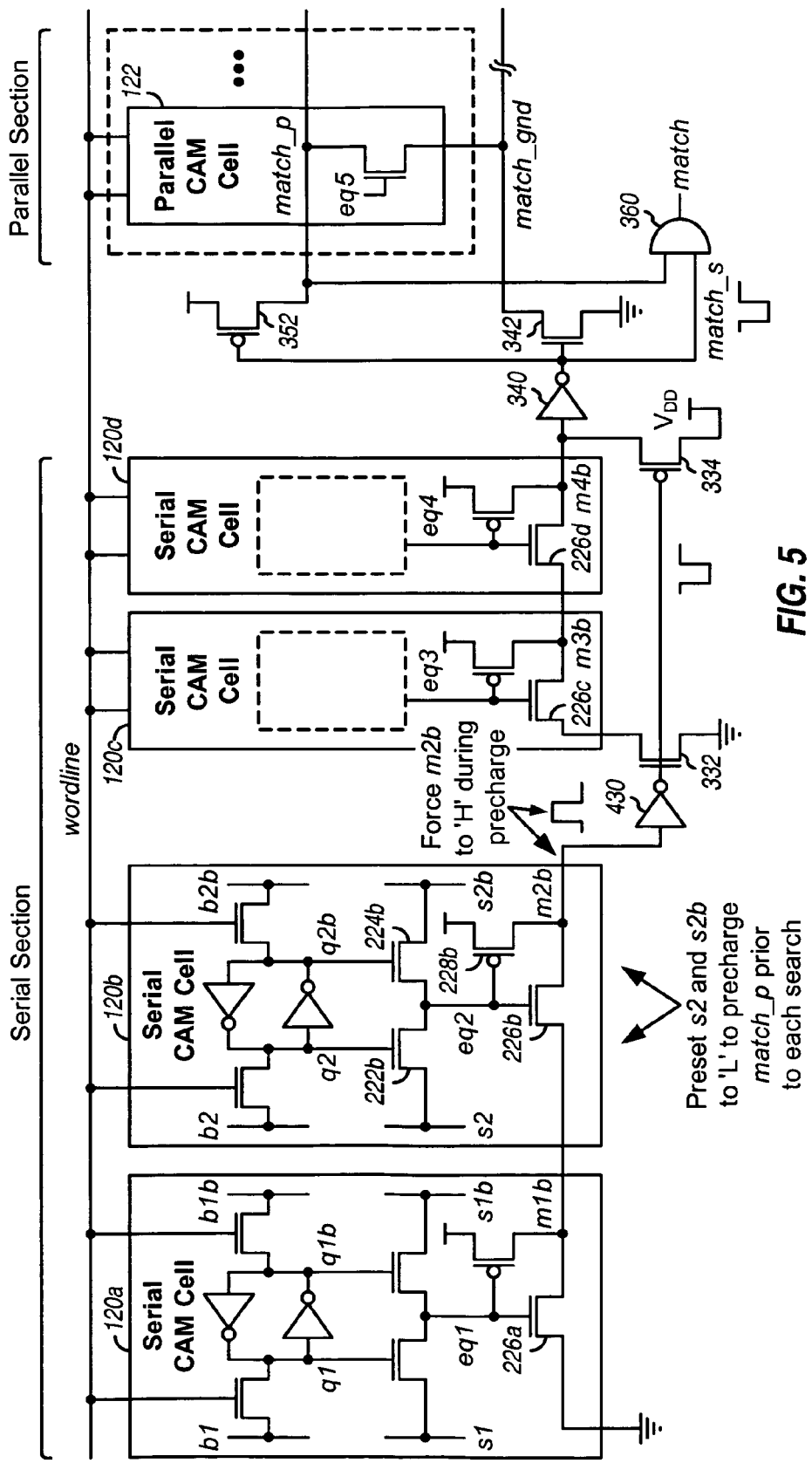

FIG. 5 shows one row 500 of CAM cells for a mixed serial-parallel CAM that supports only the sequential mode without any timing signals for the serial section. Row 500 includes a serial section with four serial CAM cells 120a through 120d and a parallel section with multiple parallel CAM cells 122, as shown in FIGS. 3 and 4. Row 500 further includes all of the support circuitry for row 400 in FIG. 4, except that NOR gate 350, N-FET 344, and P-FET 354 have been omitted since the parallel mode is not supported. The gate of P-FET 352 couples to the output of inverter 340.

For the embodiment shown in FIG. 5, either N-FET 342 or P-FET 352 is turned ON at any given moment. Prior to each search, the s2 and s2b lines for the second serial CAM cell is preset, a logic low is generated at the output of inverter 340, P-FET 352 is turned ON, and the match_p line is precharged.

Thereafter, P-FET 352 is turned OFF, N-FET 342 is turned ON, the match_gnd line is pulled down to logic low, and the parallel section is enabled.

Figure 6:
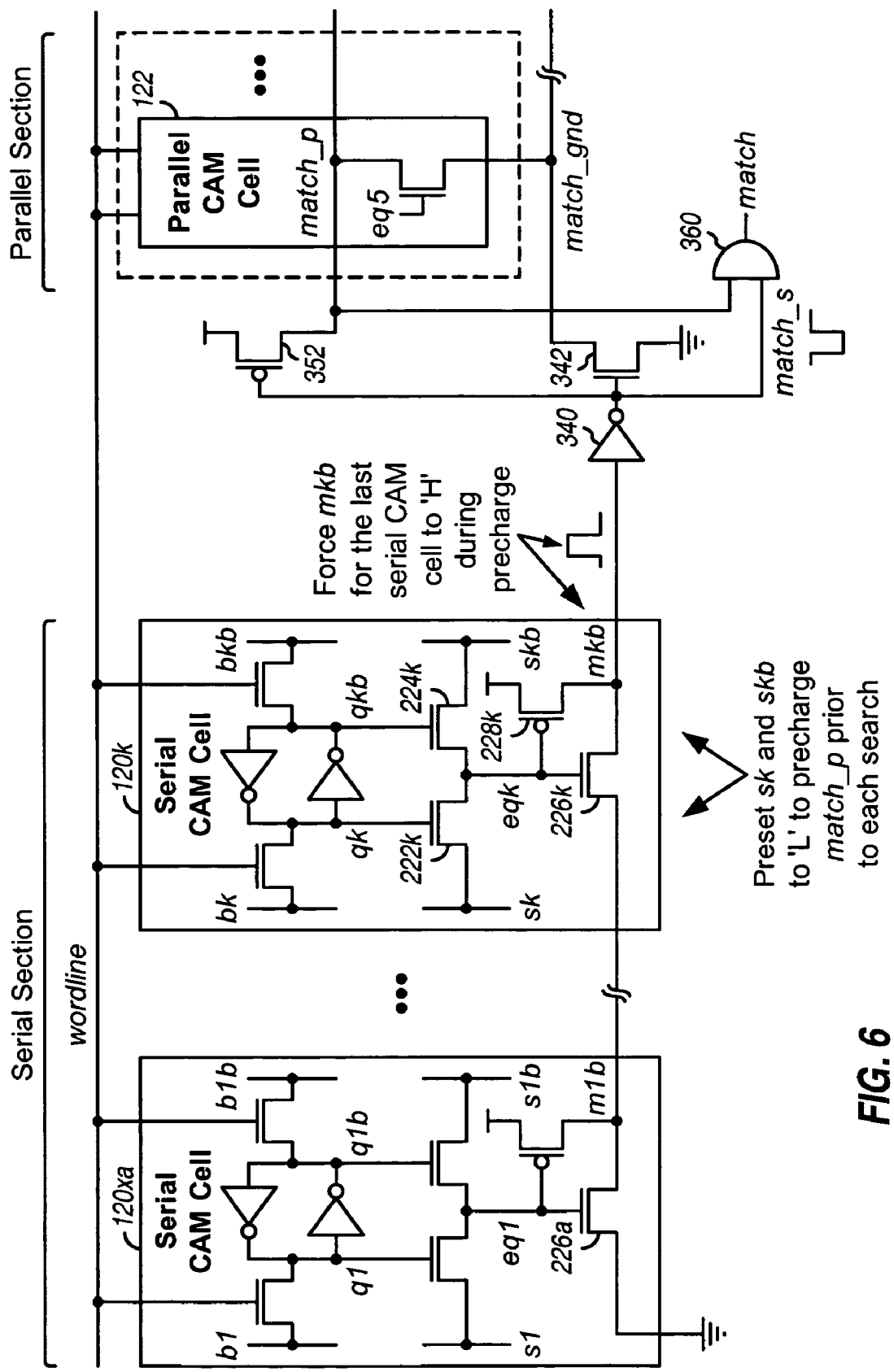

FIG. 6 shows one row 600 of CAM cells for a mixed serial-parallel CAM that supports only the sequential mode without any timing signals for the serial section. Row 600 includes a serial section with k serial CAM cells 120a through 120k and a parallel section with multiple parallel CAM cells 122. In general, k>1 (e.g., k may be 2, 3, 4 and so on). Row 600 includes all of the support circuitry for row 500 in FIG. 5, except that inverter 430, N-FET 332, and P-FET 334 are omitted. For the embodiment shown in FIG. 6, the output match line for each serial CAM cell is coupled directly to the input match line for the next serial CAM cell. The sk and skb lines for the last serial CAM cell is preset prior to each search to precharge the match_p line.

FIGS. 4, 5 and 6 show exemplary designs of a CAM that can perform mixed serial-parallel search without requiring any timing signals for the serial section. A mixed serial-parallel CAM may also be implemented with other designs based on the description provided herein.

Figure 7:
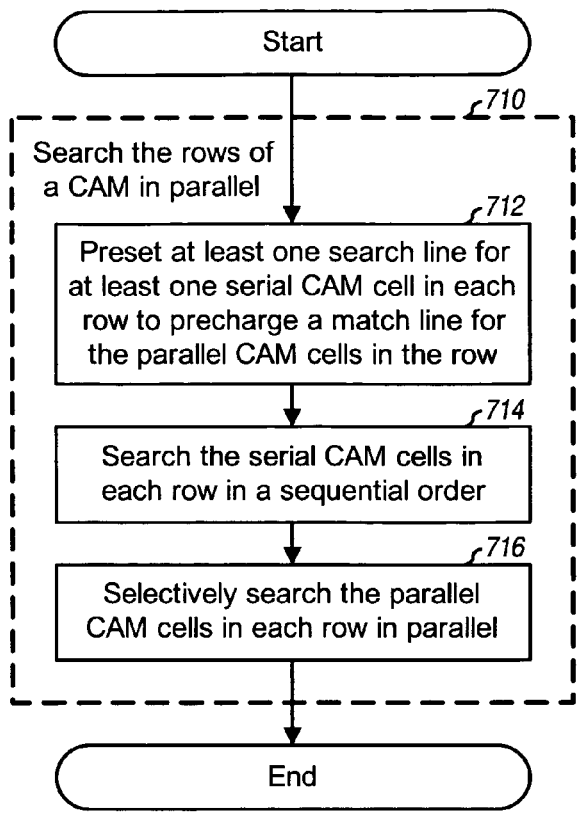
FIG. 7 shows a process for performing a mixed serial-parallel search.

FIG. 7 shows a process 700 for performing a mixed serial-parallel search of a CAM composed of multiple rows, with each row having at least one serial CAM cell and at least two parallel CAM cells. The rows of the CAM are searched in parallel (block 710). At least one search line for at least one serial CAM cell in each row is preset to precharge a match line for the parallel CAM cells in the row (block 712). For example, the search line for the second serial CAM cell (in FIGS. 4 and 5) or the last serial CAM cell (in FIG. 6) may be preset. The serial CAM cells in each row are searched in a sequential order (block 714). The parallel CAM cells in each row are selectively searched in parallel (block 716). For example, the parallel CAM cells in a given row may be searched (1) only if the serial CAM cells in that row match or (2) concurrently with the search for the serial CAM cells. A virtual ground line for the parallel CAM cells in each row may be controlled to enable or disable the searching of the parallel CAM cells.

The CAM described herein may be used for various applications. One exemplary application for the CAM is described below.

Figure 8:
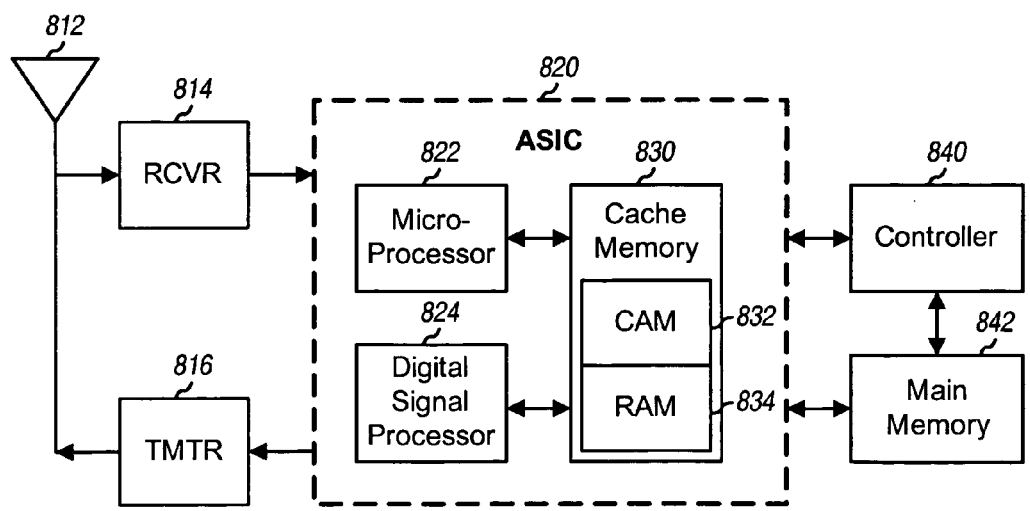
FIG. 8 shows a wireless device in a wireless communication system.

FIG. 8 shows a block diagram of a wireless device 800 in a wireless communication system. Wireless device 800 may be a cellular phone, a handset, a wireless terminal, a personal digital assistant (PDA), or some other electronics apparatus. The wireless system may be a Code Division Multiple Access (CDMA) system, a Time Division Multiple Access (TDMA) system, a Global System for Mobile Communications (GSM) system, a Frequency Division Multiple Access (FDMA) system, an orthogonal frequency division multiple access (OFDMA) system, and so on.

Wireless device 800 is capable of providing bi-directional communication via a receive path and a transmit path. For the receive path, signals transmitted by base stations are received by an antenna 812 and provided to a receiver unit (RCVR) 814. Receiver unit 814 conditions (e.g., filters, amplifies, and frequency downconverts) the received signal, digitizes the conditioned signal, and provides data samples to an application specific integrated circuit (ASIC) 820 for further processing. For the transmit path, data to be transmitted from wireless device 800 is provided by ASIC 820 to a transmitter unit (TMTR) 816. Transmitter unit 816 conditions (e.g., filters, amplifies, and frequency upconverts) the data and generates a modulated signal, which is transmitted via antenna 812 to the base stations.

ASIC 820 includes various units such as, for example, a microprocessor 822, a digital signal processor (DSP) 824, and a cache memory 826. Microprocessor 822 performs general-purpose processing and may be a reduced instruction set computer (RISC) or some other type of processor. DSP 824 performs data processing for the transmit path (e.g., encoding, interleaving, modulation, code channelization, spectral spreading, filtering, and so on) and the receive path (e.g., filtering, despreading, channelization, demodulating, deinterleaving, decoding, and so on). The processing to be performed by DSP 824 is dependent on the communication system. Cache memory 830 stores data and/or program codes for microprocessor 822 and/or DSP 824. Cache memory 830 may include a CAM 832 that stores addresses for the data and/or program codes and a RAM 834 that stores the data and/or program codes. CAM 832 may be implemented based on any of the CAM designs described herein or some other CAM design. A controller 840 controls the operation of ASIC 820 and other units within wireless device 800. A main memory 842 stores program codes and data used by controller 840.

The CAM described herein may be implemented in various hardware units such as an ASIC, a DSP, a digital signal processing device (DSPD), a programmable logic device (PLD), a field programmable gate array (FPGA), a controller, a processor, and other electronic devices. The CAM may also be fabricated in various IC process technologies such as CMOS, N-MOS, P-MOS, bipolar-CMOS (Bi-CMOS), bipolar, and so on. CMOS technology can fabricate both N-FETs and P-FETs on the same integrated circuit (IC) die, whereas N-MOS technology can only fabricate N-FETs and P-MOS technology can only fabricate P-FETs. The CAM may be fabricated using any device size technology (e.g., 130 nanometer (nm), 65 nm, 30 nm, and so on).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a plurality of serial content addressable memory (CAM) cells and a plurality of parallel CAM cells arranged in a plurality of rows and a plurality of columns, each row comprising at least one serial CAM cell and at least two parallel CAM cells; and
   a driver configured to generate a plurality of search lines for the plurality of columns and to preset at least one search line for at least one column of serial CAM cells prior to each search operation, wherein search lines for columns of parallel CAM cells are not preset.

2. The integrated circuit of claim 1, wherein each row comprises four serial CAM cells.

3. The integrated circuit of claim 2, further comprising:
   a plurality of buffer circuits, one buffer circuit for each row, each buffer circuit coupled between second and third serial CAM cells in an associated row.

4. The integrated circuit of claim 2, wherein prior to each search operation the driver is configured to preset a search line for a second column of serial CAM cells among four columns of serial CAM cells.

5. The integrated circuit of claim 1, wherein prior to each search operation the driver is configured to preset a search line for a last column of serial CAM cells among at least one column of serial CAM cells.

6. The integrated circuit of claim 1, wherein each row comprises three serial CAM cells, and wherein prior to each search operation the driver is configured to preset a search line for a last column of CAM cells among three columns of serial CAM cells.

7. The integrated circuit of claim 1, further comprising:
a plurality of match lines for a plurality of rows of parallel CAM cells, the plurality of match lines being precharged prior to each search operation by the presetting of the at least one search line.

8. The integrated circuit of claim 1, further comprising:
a plurality of virtual ground lines for a plurality of rows of parallel CAM cells, one virtual ground line for each row of parallel CAM cells, each virtual ground line being controlled to enable or disable an associated row of parallel CAM cells.

9. The integrated circuit of claim 1, wherein the plurality of rows are searched in parallel, and wherein for each row the at least one serial CAM cell is searched sequentially and the at least two parallel CAM cells are searched in parallel.

10. The integrated circuit of claim 9, wherein for each row the at least two parallel CAM cells are searched only if the at least one serial CAM cell in the row match.

11. The integrated circuit of claim 9, wherein for each row the at least two parallel CAM cells are searched in parallel and concurrently with the sequential search of the at least one serial CAM cell.

12. The integrated circuit of claim 1, wherein each of the plurality of CAM cells comprises a memory cell configured to store a data value and a comparison circuit configured to compare the stored data value with an input data value.

13. The integrated circuit of claim 1, wherein each of the plurality of CAM cells comprises first and second complementary metal oxide semiconductor (CMOS) gates, wherein the first and second CMOS gates are coupled to a differential search line and are controlled by a data value stored in the CAM cell.

14. An integrated circuit comprising:
a cache memory configured to store data and comprising
a content addressable memory (CAM) configured to store addresses for the data and comprising a plurality of serial CAM cells, a plurality of parallel CAM cells, and a driver, wherein the plurality of serial CAM cells and the plurality of parallel CAM cells are arranged in a plurality of rows and a plurality of columns, wherein each row comprises at least one serial CAM cell and at least two parallel CAM cells, wherein the driver is configured to generate a plurality of search lines for the plurality of columns of CAM cells and to preset at least one search line for at least one column of serial CAM cells prior to each search operation, and wherein search lines for columns of parallel CAM cells are not preset, and
a random access memory (RAM) configured to store the data; and a processor configured to access the cache memory for the data.

15. The integrated circuit of claim 14, wherein the processor is configured to perform processing for wireless communication.

16. A method of searching a content addressable memory (CAM) comprised of a plurality of rows of CAM cells, each row comprising at least one serial CAM cell and at least two parallel CAM cells, the method comprising:
for each of the plurality of rows of CAM cells,
presetting at least one search line for at least one serial CAM cell in the row for precharging a match line for the at least two parallel CAM cells in the row, wherein search lines for columns of parallel CAM cells are not preset,
searching the at least one serial CAM cell in the row in a sequential order, and
selectively searching the at least two parallel CAM cells in the row in parallel.

17. The method of claim 16, further comprising:
searching the plurality of rows of CAM cells in parallel.

18. The method of claim 16, wherein the presetting the at least one search line for the at least one serial CAM cell in the row comprises
presetting a search line for a last serial CAM cell in the row to precharge the match line for the at least two parallel CAM cells in the row.

19. The method of claim 16, wherein the selectively searching the at least two parallel CAM cells in the row in parallel comprises
searching the at least two parallel CAM cells in the row only if the at least one serial CAM cell in the row match.

20. The method of claim 16, wherein the selectively searching the at least two parallel CAM cells in the row in parallel comprises
searching the at least two parallel CAM cells in the row in parallel and concurrently with the searching of the at least one serial CAM cell in the row.

21. The method of claim 16, further comprising:
for each of the plurality of rows of CAM cells,
controlling a virtual ground line for the at least two parallel CAM cells in the row to enable or disable the searching of the at least two parallel CAM cells.

22. An apparatus comprising:
means for searching a content addressable memory (CAM) comprised of a plurality of rows of CAM cells, each row comprising at least one serial CAM cell and at least two parallel CAM cells, the means for searching the CAM comprising, for each of the plurality of rows of CAM cells,
means for presetting at least one search line for at least one serial CAM cell in the row to precharge a match line for the at least two parallel CAM cells in the row, wherein search lines for columns of parallel CAM cells are not preset,
means for searching the at least one serial CAM cell in the row in a sequential order, and
means for selectively searching the at least two parallel CAM cells in the row in parallel.

23. The apparatus of claim 22, wherein the means for selectively searching the at least two parallel CAM cells in the row in parallel comprises
means for searching the at least two parallel CAM cells in the row only if the at least one serial CAM cell in the row match.

24. The apparatus of claim 22, wherein the means for selectively searching the at least two parallel CAM cells in the row in parallel comprises
means for searching the at least two parallel CAM cells in the row in parallel and concurrently with the means for searching of the at least one serial CAM cell in the row.

* * * * *